(12) United States Patent
Paranthaman et al.

(10) Patent No.: US 10,586,640 B2
(45) Date of Patent: Mar. 10, 2020

(54) NEODYMIUM-IRON-BORON MAGNET WITH SELECTIVE SURFACE MODIFICATION, AND METHOD OF PRODUCING SAME

(71) Applicants: UT-Battelle, LLC, Oak Ridge, TN (US); Iowa State University Research Foundation, Inc., Ames, IA (US); Lawrence Livermore National Laboratory, Livermore, CA (US)

(72) Inventors: Mariappan Parans Paranthaman, Knoxville, TN (US); Michael A. McGuire, Knoxville, TN (US); David S. Parker, Oak Ridge, TN (US); Orlando Rios, Knoxville, TN (US); Brian C. Sales, Lenoir City, TN (US); Huseyin Ucar, Auburndale, FL (US); Scott K. McCall, Livermore, CA (US); R. William McCallum, Ames, IA (US); Cajetan I. Nlebedim, Ames, IA (US)

(73) Assignees: UT-BATTELLE, LLC, Oak Ridge, TN (US); IOWA STATE UNIVERSITY RESEARCH FOUNDATION, INC., Ames, IA (US); LAWRENCE LIVERMORE NATIONAL SECURITY, LLC, Livermore, CA (US)

(*) Notice: Subject to any disclaimer, the term of this patent is extended or adjusted under 35 U.S.C. 154(b) by 172 days.

(21) Appl. No.: 15/415,766

(22) Filed: Jan. 25, 2017

(65) Prior Publication Data
US 2017/0213626 A1    Jul. 27, 2017

Related U.S. Application Data

(60) Provisional application No. 62/286,656, filed on Jan. 25, 2016.

(51) Int. Cl.
*H01F 7/02* (2006.01)
*H01F 1/057* (2006.01)
(Continued)

(52) U.S. Cl.
CPC ........... *H01F 7/021* (2013.01); *C21D 6/00* (2013.01); *C22C 38/002* (2013.01);
(Continued)

(58) Field of Classification Search
None
See application file for complete search history.

(56) References Cited

U.S. PATENT DOCUMENTS 8,206,516 B2 * 6/2012 Yoshimura ............ B22F 7/062
148/101
2001/0031549 A1   10/2001 Crawford et al.
(Continued)

OTHER PUBLICATIONS

H. Ucar, D.S. Parker, I.C. Nlebedim, R.W. McCallum, S.K. McCall, M. Parans Paranthaman, Strategic coating of NdFeB magnets with Dy to improve the coercivity of permanent magnets, Adv. Mater. Res., 4 (2015) (Year: 2015).*
(Continued)

*Primary Examiner* — Kevin M Bernatz
(74) *Attorney, Agent, or Firm* — Scully Scott Murphy & Presser, P.C.

(57) ABSTRACT

A bulk high performance permanent magnet comprising a neodymium-iron-boron core having an outer surface, and a coercivity-enhancing element residing on at least a portion of said outer surface, with an interior portion of said neodymium-iron-boron core not having said coercivity-enhancing element therein. Also described herein is a method for producing the high-coercivity bulk permanent magnet, the method comprising: (i) depositing a coercivity-enhancing element on at least a portion of an outer surface of a neodymium-iron-boron core substrate to form a coated permanent magnet; and (ii) subjecting the coated permanent magnet to a pulse thermal process that heats said outer surface to a substantially higher temperature than an interior portion of said neodymium-iron-boron core substrate,
(Continued)

wherein said substantially higher temperature is at least 200° C. higher than said interior portion and is of sufficient magnitude to induce diffusion of said coercivity-enhancing element below said outer surface but outside of said interior portion.

7 Claims, 5 Drawing Sheets

(51) Int. Cl.
    *H01F 41/02*     (2006.01)
    *C22C 38/00*     (2006.01)
    *C21D 6/00*     (2006.01)
    *C23C 14/16*     (2006.01)

(52) U.S. Cl.
    CPC .......... *C22C 38/005* (2013.01); *C23C 14/165* (2013.01); *H01F 41/0293* (2013.01); *H01F 1/0577* (2013.01)

(56) References Cited

U.S. PATENT DOCUMENTS

| | | |
|---|---|---|
| 2005/0068138 A1 | 3/2005 | Amm et al. |
| 2008/0085368 A1 | 4/2008 | Gauthier |
| 2008/0286595 A1* | 11/2008 | Yoshimura .............. B22F 7/062 428/548 |
| 2009/0020193 A1* | 1/2009 | Ohta ..................... H01F 1/0577 148/559 |
| 2010/0182113 A1 | 7/2010 | Yoshimura et al. |
| 2011/0012699 A1 | 1/2011 | Odaka et al. |
| 2017/0236626 A1* | 8/2017 | Chen ................... H01F 41/0293 428/546 |

OTHER PUBLICATIONS

International Search Report dated Apr. 18, 2017 issued in PCT/US17/14986.

\* cited by examiner

NEODYMIUM-IRON-BORON MAGNET WITH SELECTIVE SURFACE MODIFICATION, AND METHOD OF PRODUCING SAME

CROSS REFERENCE TO RELATED APPLICATION

The present application claims benefit of U.S. Provisional Application No. 62/286,656, filed on Jan. 25, 2016, all of the contents of which are incorporated herein by reference.

STATEMENT REGARDING FEDERALLY SPONSORED RESEARCH

This invention was made with government support under Prime Contract No. DE-AC05-000R22725 and DE-AC02-07CH11358 awarded by the U.S. Department of Energy. The government has certain rights in the invention.

FIELD OF THE INVENTION

The present invention relates, generally, to permanent magnets with high coercivities and methods of producing them, and more specifically, to high coercivity permanent magnets (particularly Nd—Fe—B types) doped with a coercivity-enhancing element and methods for producing them.

BACKGROUND OF THE INVENTION

Sintered neodymium-iron-boron (i.e., Nd—Fe—B or $Nd_2Fe_{14}B$) magnets are commonly used for various magnetic circuits including motors, generators, medical instruments, hard disk drives, and measuring devices because of their high magnetic performance. In order to increase the high temperature coercivity of sintered $Nd_2Fe_{14}B$, dysprosium (Dy) or another coercivity-enhancing element can be substituted for Nd in the magnets. This enhancement occurs because $(Nd_{1-x}Dy_x)_2Fe_{14}B$ has a higher magnetic anisotropy than that of $Nd_2Fe_{14}B$.

Nevertheless, there are substantial disadvantages in the current methodology employed for producing Dy-enhanced $Nd_2Fe_{14}B$ magnets. One disadvantage is the high cost of heavy rare earth (HRE) elements, such as Dy. Global production of Dy is about 1700 Mt (metric tons) annually. Moreover, in the conventional art, Dy may comprise as much as 5 weight percent of these magnets. It is typically added in bulk in order to improve high temperature coercivity, though at a significant penalty to the magnetization. Another disadvantage is the performance loss (e.g., significant loss in coercivity) as a result of the annealing processes of the art in which the permanent magnet is annealed at elevated temperatures for extended periods (e.g., hours) to ensure diffusion of the Dy throughout the bulk of the magnet.

SUMMARY OF THE INVENTION

In one aspect, the instant disclosure is directed to a bulk permanent magnet comprising a neodymium-iron-boron core having an outer surface, and a coercivity-enhancing element residing on at least a portion of the outer surface, with an interior portion of the neodymium-iron-boron core not having the coercivity-enhancing element therein. In one particular embodiment, the coercivity-enhancing element resides on the entire outer surface of the neodymium-iron-boron core, with an interior portion of the neodymium-iron-boron core not having the coercivity-enhancing element therein. In another particular embodiment, the outer surface includes at least one edge or corner, and the coercivity-enhancing element selectively resides on and in the vicinity of the edge or corner, with other portions of the outer surface not having the coercivity-enhancing element residing thereon.

In another aspect, the instant disclosure is directed to methods for producing the high-coercivity bulk permanent magnet described above. More specifically, the method includes: (i) depositing a coercivity-enhancing element on at least a portion of an outer surface of a neodymium-iron-boron core substrate to form a coated permanent magnet; and (ii) subjecting the coated permanent magnet to a pulse thermal process that heats the outer surface to a substantially higher temperature than an interior portion of the neodymium-iron-boron core substrate, wherein the substantially higher temperature is at least 200° C. higher than in the interior portion and is of sufficient magnitude to induce diffusion of the coercivity-enhancing element below the outer surface but outside of the interior portion.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

(FIG. 1A); and the effect of energy product $(BH_{max})$ with annealing temperatures (FIG. 1B).

DETAILED DESCRIPTION OF THE INVENTION

Figure 1A:
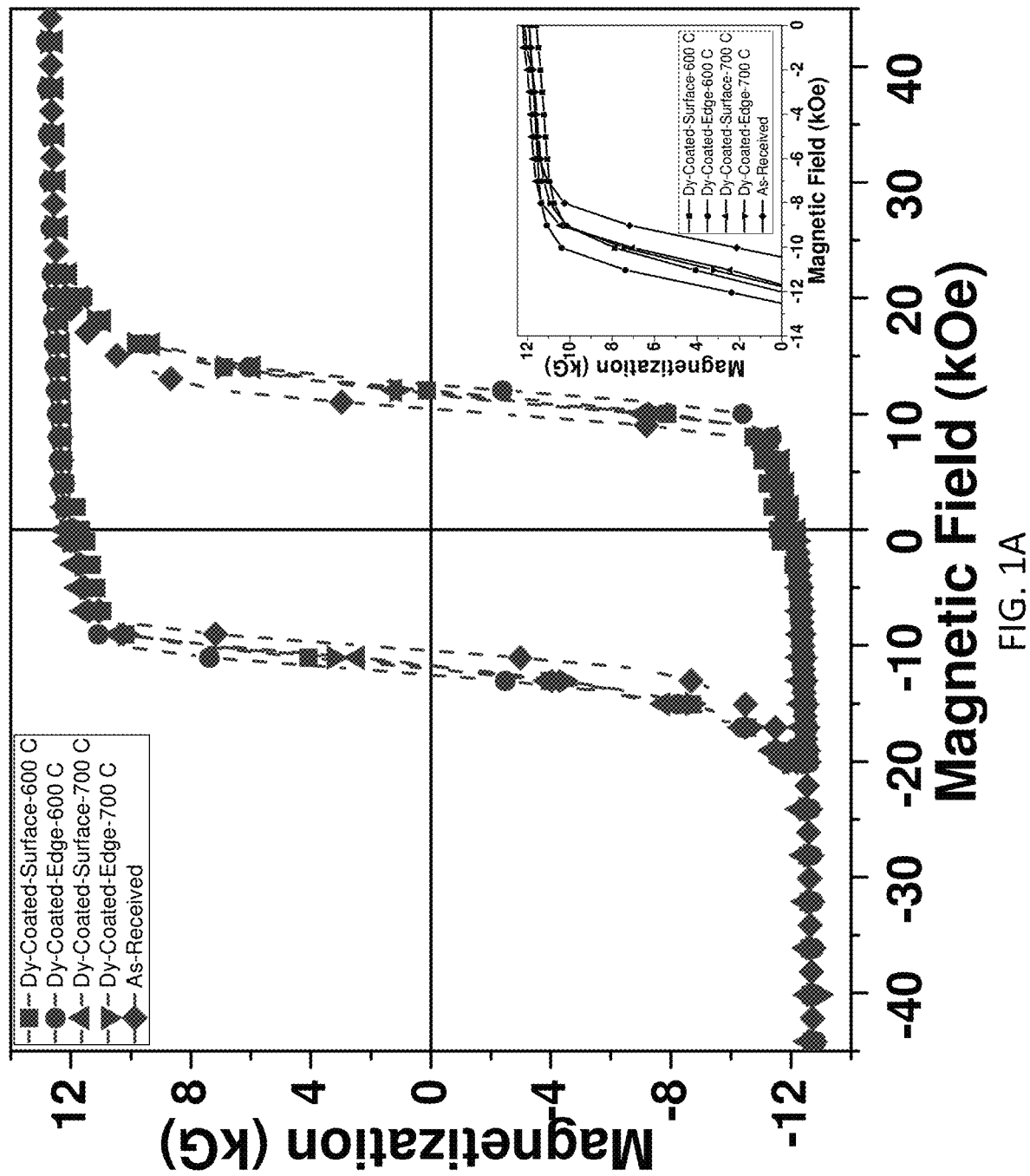
FIGS. 1A-1B. Hysteresis loops of a commercial $Nd_2Fe_{14}B$ (N38 grade) magnet that was surface and edge sputter-coated with Dy followed by heat treatment at 600° C. and 700° C.

In one aspect, the instant disclosure is directed to a bulk permanent magnet having a neodymium-iron-boron core having an outer surface, and a coercivity-enhancing element residing on at least a portion of said outer surface. The term "bulk," as used herein, in reference to the permanent magnet, refers to a macroscopic object, and thus, serves to differentiate from a microscopic or nanoscopic object. Thus, the bulk permanent magnet considered herein is of macroscopic size, which is generally a size of at least 1 millimeter (mm) for at least one of the dimensions of the bulk permanent magnet. In specific embodiments, the bulk permanent magnet may have a size of at least 1 cm for at least one of its dimensions. In some embodiments, the permanent magnet has a planar (layer) shape, generally with a thickness of up to or less than 10 mm, e.g., up to or less than 5, 4, 3, 2, or 1 mm.

The Nd—Fe—B core may, in one embodiment, have no edges or corners, such as in a smoothened disk or sphere. In other embodiments, the Nd—Fe—B core has at least one edge and no corners, such as in an edged disk. In yet other embodiments, the Nd—Fe—B core has at least one corner, such as in a parallelepiped, such as a cube, block, or layer shape, or other polyhedral shape.

The term "neodymium-iron-boron" (i.e., Nd—Fe—B) refers to those permanent magnet compositions, as known in the art, which contain at least neodymium (Nd), iron (Fe), and boron (B). Most typical of these compositions is $Nd_2Fe_{14}B$, but other lesser known variations are considered herein, such as any of the compositions within the scope of the generic formula $(Nd_{1-x}M_x)_2Fe_{14}B$, where M is generally a coercivity-enhancing element (i.e., other than Nd, Fe, or B) and x is less than 1, more typically up to or less than 0.5, 0.4, 0.3, 0.2, or 0.1. In some embodiments, a coercivity-enhancing element is not included in the Nd—Fe—B composition, and the Nd—Fe—B composition contains only Nd, Fe, and B.

The term "core," as used herein, refers to a volume contained within the bounds of an outer surface. Thus, the "Nd—Fe—B core" refers to a volume of Nd—Fe—B contained within the bounds of an outer surface. The outer surface thus delineates the contours and surface features of an object composed of Nd—Fe—B.

The coercivity-enhancing element is any element that can increase the coercivity of a permanent magnet, such as the Nd—Fe—B magnet of this invention. The element may be, for example, a transition or lanthanide element. The transition element refers to any of the elements of Groups 3-12 of the Periodic Table, and may be a first, second, or third row transition metal. Some examples of transition elements include, for example, scandium (Sc), titanium (Ti), vanadium (V), chromium (Cr), manganese (Mn), iron (Fe), cobalt (Co), nickel (Ni), copper (Cu), and zinc (Zn), all of which are first row transition elements. The lanthanide element refers to any of the elements having an atomic number of 57-71, e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). In some embodiments, a single coercivity-enhancing element is used, while in other embodiments two or more coercivity-enhancing elements are used. In some embodiments, the coercivity-enhancing element is selected from Dy, Ce, Mn, Co, or Ni, or only one or more lanthanide elements may be used, such as Dy or Ce.

The coercivity-enhancing element resides on at least a portion of the outer surface of the Nd—Fe—B core. The term "at least a portion" means that the coercivity-enhancing element may reside on a portion of the outer surface or on the entire outer surface. However, for purposes of the instant invention, there remains at least an interior portion of the Nd—Fe—B core that does not contain the coercivity-enhancing element.

In another aspect, the instant disclosure is directed to a method for producing the above-described bulk permanent magnet. In the method, a coercivity-enhancing element is first deposited on at least a portion of an outer surface of a neodymium-iron-boron core substrate to form a coated permanent magnet. The coercivity-enhancing element can be deposited by any suitable process, such as by solution deposition or radiofrequency (rf) sputtering. The coated permanent magnet is then subjected to a pulse thermal process that heats the outer surface to a substantially higher temperature than an interior portion of the neodymium-iron-boron core substrate. By using a pulse thermal process, the substantially higher temperature at the surface is at least 200° C. higher than an interior portion of the Nd—Fe—B core and is of sufficient magnitude to induce a limited diffusion of the coercivity-enhancing element below the outer surface but outside of the interior portion. Generally, the pulse thermal process heats the outer surface to a high temperature of at least 500° C., 600° C., 700° C., 800° C., 900° C., or 1000° C., or a temperature within a range bounded by any two of the foregoing values.

The pulse thermal process achieves only surface level diffusion (i.e., without diffusion of the coercivity-enhancing element throughout the bulk of the Nd—Fe—B core) by employing a short pulse period during which the Nd—Fe—B core substrate is subjected to the high temperature. In this way, the surface is subjected to a significantly higher temperature than the interior of the Nd—Fe—B core substrate. The pulse period is generally less than 1 minute, and more typically, up to or less than 30 seconds. In some embodiments, the pulse period is precisely, up to, or less than 1, 2, 3, 4, 5, 6, 7, 8, 9, or 10 seconds. Any process known in the art capable of providing a high temperature pulse can be employed herein. In some embodiments, a pulse induction process is used, the operational details of which are well known in the art, e.g., O. Lucia et al., *IEEE Transactions on Industrial Electronics*, 2013, vol. 61 (n5), pp. 2509-2520. In particular embodiments, the pulse induction process operates by high frequency induction, the operational details of which are well known in the art. In some embodiments, the pulse thermal method is, for example, a high density plasma arc lamp method or a focused (e.g., laser) electromagnetic beam method, all of which are well known in the art. In the case of an electromagnetic beam, the electromagnetism may be, for example, infrared, microwave, visible, or ultraviolet radiation.

In one embodiment, the coercivity-enhancing element is deposited on the entire outer surface of the neodymium-iron-boron core substrate and the pulse thermal process heats the outer surface to a substantially higher temperature than an interior portion of the neodymium-iron-boron core substrate. In this way, the pulse thermal process heats the outer surface to at least 200° C. higher than the interior portion of the Nd—Fe—B and is of sufficient magnitude to induce diffusion of the coercivity-enhancing element below the outer surface but outside of the interior portion of the Nd—Fe—B core.

In another embodiment, the coercivity-enhancing element is deposited on a select portion of the outer surface of the neodymium-iron-boron core substrate, while not depositing the coercivity-enhancing element on other portions of the outer surface. In this way, the pulse thermal process heats the outer surface to at least 200° C. higher than the interior portion of the Nd—Fe—B and is of sufficient magnitude to induce diffusion of the selectively-deposited coercivity-enhancing element below the outer surface but outside of the interior portion of the Nd—Fe—B core. The coercivity-enhancing element can be deposited on, for example, specific areas of the outer surface; particularly on an edge or corner of the outer surface, which may also include the vicinity of an edge or corner.

Examples have been set forth below for the purpose of illustration and to describe certain specific embodiments of the invention. However, the scope of this invention is not to be in any way limited by the examples set forth herein.

EXAMPLES

Selective Surface Modification of a $Nd_2Fe_{14}B$ Magnet with Dy

Figure 1B:
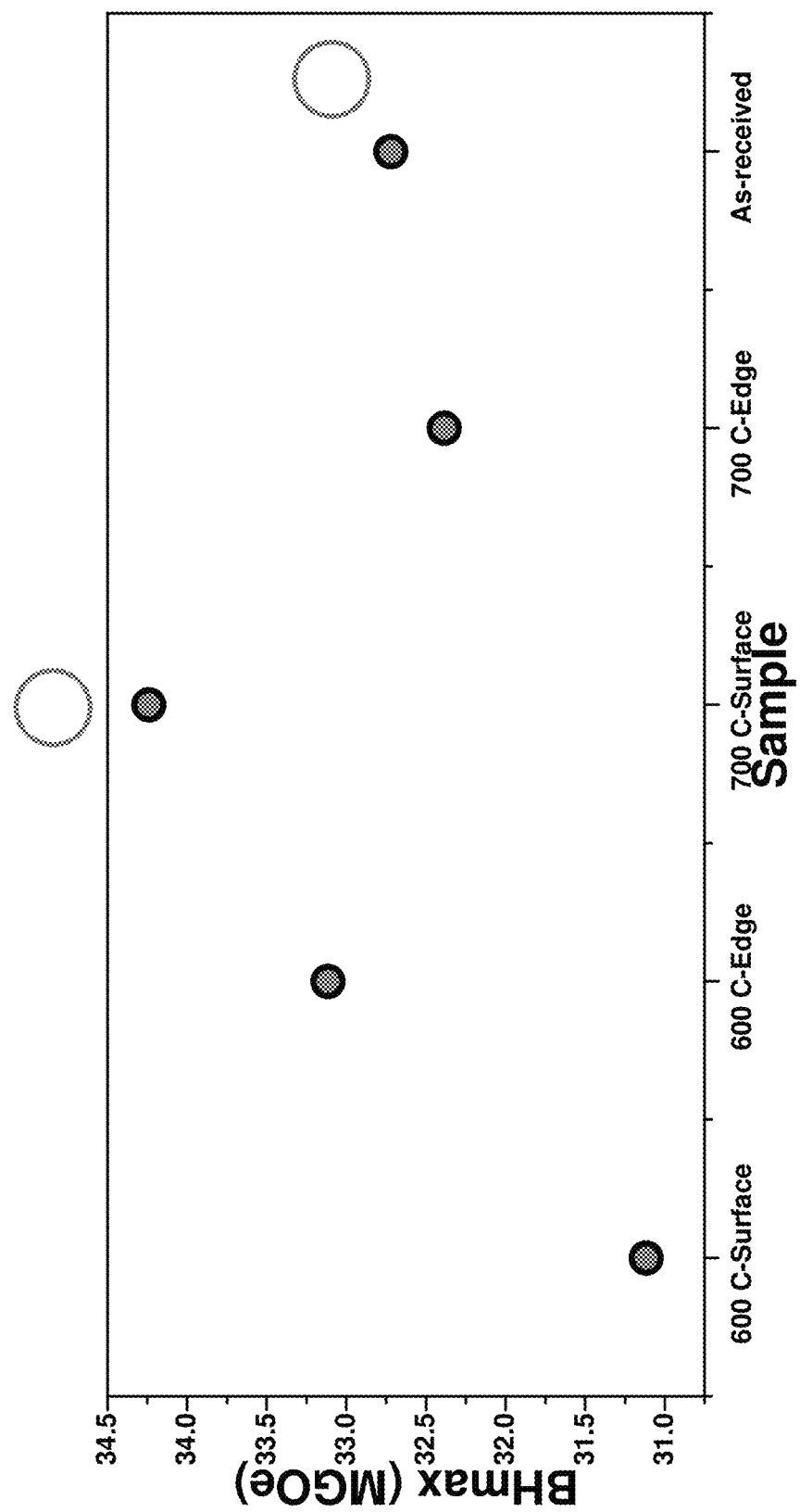

Selective surface modification of $Nd_2Fe_{14}B$ magnets with Dy yields an improved energy product. Based on a theoretical understanding of the areas of high flux concentration, both the surface and edge of a commercial N-38 $Nd_2Fe_{14}B$ magnet (5.5 mm×3.5 mm×3 mm) were coated with Dy sputtering followed by annealing under a magnetic field. As shown by the hysteresis loops in FIGS. 1A and 1B, this resulted in about a 5% improvement in energy product for the N-38 $Nd_2Fe_{14}B$ magnet.

Figure 2:
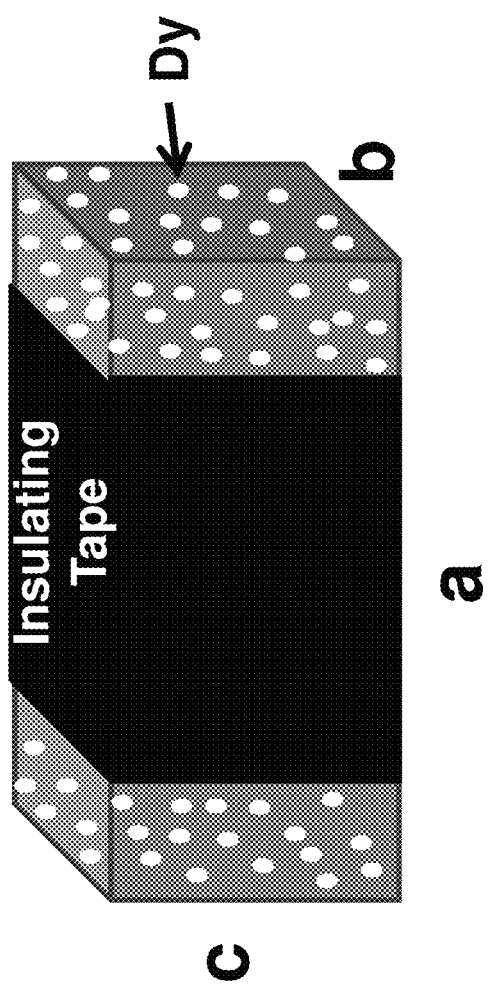
FIG. 2. Schematic of the $Nd_2Fe_{14}B$ (N38 grade) magnet surfaces where Dy was sputter-coated onto the edges, with other areas masked.

The commercial grade N-38, Nd—Fe—B magnets were used as a baseline in this study. The baseline magnets with a thickness of 3 mm were sputtered with a Dy film thickness of 200 nm using an rf-magnetron sputtering unit followed by a heat treatment at 600-700° C. for 4 hours to promote Dy diffusion in sealed quartz ampoules. Two configurations were assessed in this study. First, the whole top surface of the magnet was coated with Dy. In the second configuration, the main body of the magnet was covered with a carbon tape and this allowed the Dy coating only on the top edges of the sample, as schematically shown in FIG. 2. Control samples were also studied to delineate the effects of heat treatment from the effect of Dy diffusion. Magnetization was measured in a SQUID magnetometer with magnetic field applied parallel alignment direction. Notably, computer modeling was undertaken to help determine the regions of largest demagnetization in a Nd—Fe—B substrate having edges and corners. From these calculations, it was determined that the largest demagnetization factor for a parallelepiped in a uniform magnetic field is at the edges and corners.

Figure 3:
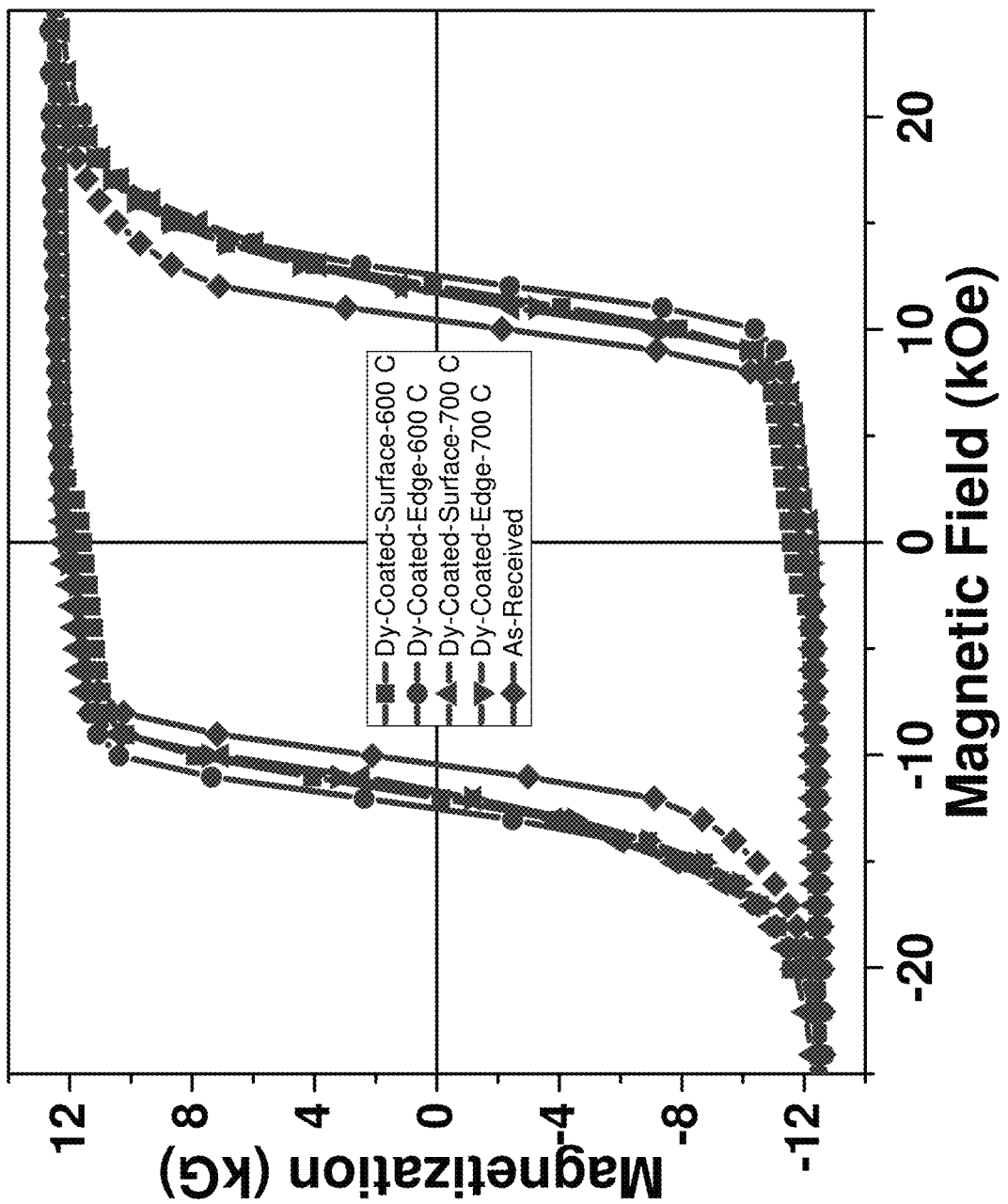
FIG. 3. Hysteresis loops after sputter deposition of Dy films onto both edges and whole surface of the magnet followed by post-annealing at 600° C. and 700° C.
Figure 4:
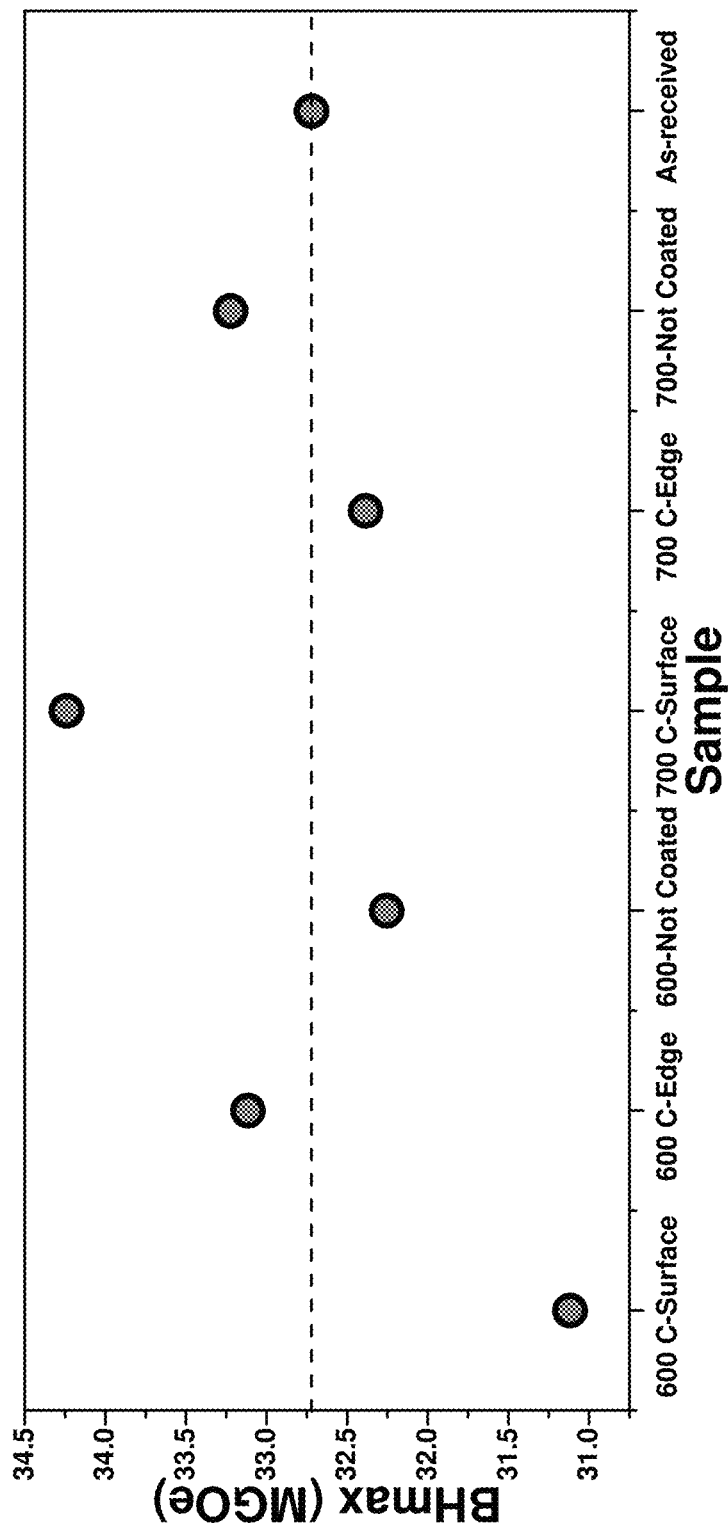
FIG. 4. Plot of energy product, $BH_{max}$ vs. samples after sputter deposition of Dy films onto both edges and whole surface of the $Nd_2Fe_{14}B$ (N38 grade) magnet followed by post-annealing at 600° C. and 700° C.

As shown in FIG. 3, the energy product of the sample which was coated only on the edges increased more than that of the whole surface treated magnet, at 600° C. annealing temperature. However, the trend at 700° C. annealing temperature appears to be the opposite where an increase of 5 percent in energy product was achieved for a total Dy weight percentage of 0.06 percent. By assuming all Dy diffused into NdFeB magnets, the improvement in energy product corresponds to a savings of over 1% Dy (critical element). FIG. 4 is a plot of the energy product, $BH_{max}$ vs. samples after sputter deposition of Dy films onto both edges and whole surface of the $Nd_2Fe_{14}B$ (N38 grade) magnet followed by post-annealing at 600 and 700° C.

While there have been shown and described what are at present considered the preferred embodiments of the invention, those skilled in the art may make various changes and modifications which remain within the scope of the invention defined by the appended claims.

What is claimed is:

1. A bulk permanent magnet comprising a neodymium-iron-boron core having an outer surface defining within its contours an interior of said bulk permanent magnet, and a coercivity-enhancing element residing on at least a portion of said outer surface, with at least a portion of said interior not having said coercivity-enhancing element therein, wherein said coercivity-enhancing element is selected from lanthanide elements, manganese, cobalt, and nickel, and wherein said outer surface includes at least one edge or corner, and said coercivity-enhancing element selectively resides on and in the vicinity of said edge or corner, with other portions of said outer surface not having said coercivity-enhancing element residing thereon.

2. The bulk permanent magnet of claim 1, wherein said coercivity-enhancing element comprises dysprosium.

3. The bulk permanent magnet of claim 1, wherein said outer surface includes at least one edge and no corners.

4. The bulk permanent magnet of claim 1, wherein said outer surface includes at least one corner.

5. The bulk permanent magnet of claim 1, wherein said neodymium-iron-boron core has a polyhedral shape.

6. The bulk permanent magnet of claim 1, wherein said neodymium-iron-boron core has a rectangular parallelepiped shape.

7. The bulk permanent magnet of claim 1, wherein said coercivity-enhancing element is selected from dysprosium, cerium, manganese, cobalt, and nickel.

* * * * *